(12) United States Patent
Wang et al.

(10) Patent No.: US 10,580,857 B2
(45) Date of Patent: Mar. 3, 2020

(54) METHOD TO FORM HIGH PERFORMANCE FIN PROFILE FOR 12LP AND ABOVE

(71) Applicant: GLOBALFOUNDRIES, Inc., Grand Cayman (KY)

(72) Inventors: Yanzhen Wang, Clifton Park, NY (US); Xinyuan Dou, Clifton Park, NY (US); Hongliang Shen, Ballston Lake, NY (US); Sipeng Gu, Clifton Park, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 16/010,694

(22) Filed: Jun. 18, 2018

(65) Prior Publication Data
US 2019/0386100 A1 Dec. 19, 2019

(51) Int. Cl.
| H01L 29/06 | (2006.01) |
| H01L 21/02 | (2006.01) |
| H01L 29/78 | (2006.01) |
| H01L 29/66 | (2006.01) |
| H01L 21/762 | (2006.01) |

(52) U.S. Cl.
CPC ...... *H01L 29/0653* (2013.01); *H01L 21/0217* (2013.01); *H01L 21/76232* (2013.01); *H01L 29/66795* (2013.01); *H01L 29/7851* (2013.01)

(58) Field of Classification Search
CPC .................................................. H01L 29/0653
USPC ......................................................... 257/401
See application file for complete search history.

(56) References Cited

U.S. PATENT DOCUMENTS

| 6,265,302 | B1 * | 7/2001 | Lim | H01L 21/76232 |
| | | | | 257/E21.507 |
| 2008/0290420 | A1 * | 11/2008 | Yu | H01L 21/823807 |
| | | | | 257/374 |
| 2009/0017596 | A1 * | 1/2009 | Hanson | H01L 21/02164 |
| | | | | 438/431 |
| 2015/0295005 | A1 * | 10/2015 | Tseng | H01L 27/14638 |
| | | | | 257/446 |
| 2016/0276342 | A1 * | 9/2016 | Lim | H01L 27/0886 |
| 2019/0035633 | A1 * | 1/2019 | Jha | H01L 21/28123 |

* cited by examiner

*Primary Examiner* — Igwe U Anya

(57) ABSTRACT

A shallow trench isolation (STI) structure is formed from a conventional STI trench structure of a first dielectric material extending into the substrate. The conventional STI structure undergoes further processing: removing a first portion of the dielectric material and adjacent portions of the semiconductor substrate to create a first recess, and then removing another portion of the dielectric material to create a second recess in just the dielectric material. A nitride spacer layer is formed above the remaining dielectric material and on the sidewalls of the substrate. A second dielectric material is formed on the spacer layer and fills the remainder of first and second recesses to a lever above the substrate. A nitride capping layer and another dielectric layer are disposed above the second material, thereby substantially encasing the STI structure in nitride. This provides a taller STI structure that results in a better fin profile during a subsequent fin reveal process.

19 Claims, 14 Drawing Sheets

US 10,580,857 B2

METHOD TO FORM HIGH PERFORMANCE FIN PROFILE FOR 12LP AND ABOVE

TECHNICAL FIELD

The present disclosure relates generally to the manufacture of semiconductor devices, and more particularly, to the fabrication and manufacture of a novel shallow trench isolation (STI) process and structure for use with fin field-effect transistor (finFET) type structures.

BACKGROUND

Single diffusion break (SDB) devices are becoming more desirable due to their improved performance capabilities. However, the present performance of such devices is affected by the resulting shape of the fin structure. Prior art processes typically include a fin reveal process that includes either a chemical oxide removal (COR) only step, or a combination of etching step and COR step. In the past, utilization of a COR only fin reveal process generally resulted in a desired rectangular fin profile, but this process removes too much of the STI oxide subjecting SDB devices to increased failure. In response, a two-step fin reveal process was utilized including both etching (e.g., radial line slot antenna (RLSA)) and COR. This combination process reduced the amount of STI oxide loss, however, the fin profile became more rounded at the top. This is undesirable as the round shape impacts contact resistance, device drive current and leakage current.

In addition to the foregoing issues of the prior art SDB FinFET device(s), when both SDB FinFET devices and double diffusion break (DDB) FinFET devices are fabricated on the same chip, it is desirable to match closely the Fin heights of the two types of devices. When utilizing an anisotropic etching process (or at least partially anisotropic process) for the Fin reveal process, including a two-step process such as etching and chemical oxide removal (COR), this results in a relatively wide recess in the silicon (and the Fin is recessed at the edges), a taller raised STI region, and shorter Fin height (silicon loss from top of fin, e.g., on order of 10 nm) and rounded Fin top.

The wider silicon recess and raised STI height degrade the aspect ratio (AR) in the SDB structure. In addition, the recessed edges of the Fin structure may result in big facets in the source/drain (S/D) region, thereby causing a weaker junction and contact landing problems. Having a short Fin height leads to weaker device performance, and may cause problems when seeking to match Fin heights between SDB structures and DDB structures.

Accordingly, there is a need for a new fin reveal process and new trench isolation structure (and methods of manufacture/fabrication) that maintain a relatively rectangular fin profile while removing less STI oxide. This achieves smaller silicon recess widths, shorter raised STI heights, increased Fin heights and/or flatter and more rectangular Fin profile tops, thereby resulting in improved device performance.

SUMMARY

In accordance with one advantageous embodiment, there is provided a semiconductor device having a semiconductor substrate and a shallow trench isolation (STI) structure disposed within the semiconductor substrate. The STI structure includes a first STI layer disposed in the substrate, a second STI layer disposed above the first STI layer and within the substrate, and the second STI layer comprises a first lower layer disposed above the first STI layer, a first vertical layer disposed along a first vertical sidewall of the substrate, and a second vertical layer disposed along a second vertical sidewall of the substrate. The device further includes a third STI layer disposed above the first lower layer of the second STI layer, and the third STI layer is disposed within the substrate and extends above a surface of the substrate. A field effect transistor (FET) is disposed on the semiconductor substrate and having a first gate structure, an epitaxial first source/drain (S/D) region, and an epitaxial second S/D region, wherein the epitaxial first S/D region is disposed adjacent to the STI structure.

In another embodiment, there is provided a method of manufacturing of fabricating a semiconductor device for use with one or more field-effect transistor (FinFET) devices. The method includes forming a shallow trench isolation (STI) structure within a semiconductor substrate from a shallow trench of first insulating material. Forming the STI structure includes: forming a mask layer to selectively expose the first insulating material and adjacent portions of the semiconductor substrate; removing a first portion of the first insulating material and the substrate using the mask layer to form a first recess in the substrate having a first depth and expose vertical sidewall portions of the substrate; removing a second portion of the first insulating material using a chemical oxide removal process, thereby forming a second recess having a second depth wherein a third portion of the first insulating material remains; forming an inner spacer layer above the third portion of the first insulating material and along the exposed vertical sidewalls of the substrate; forming a layer of second insulating material above the inner spacer layer, the second insulating material extending above a surface of the substrate and below a top surface of the masking layer; forming a capping layer above the second insulating material; and forming a layer of third insulating material above the capping layer, thereby forming the STI structure comprising the third portion of first insulating material, the inner spacer layer, the second insulating material, and the capping layer, and the third insulating material. The mask layer is removed leaving at least a portion of the STI structure disposed above the surface of the substrate.

In accordance with yet another embodiment, there is provided a method of fabricating one or more field-effect transistor (FinFET) devices. The method includes forming a shallow trench isolation (STI) structure within a semiconductor substrate from a shallow trench of first insulating material. The STI structure includes a first STI layer disposed in the substrate; a second STI layer disposed above the first STI layer and within the substrate, the second STI layer comprising, a first lower layer disposed above the first STI layer, a first vertical layer disposed along a first vertical sidewall of the substrate, and a second vertical layer disposed along a second vertical sidewall of the substrate; a third STI layer disposed above the first lower layer of the second STI layer, wherein the third STI layer is disposed within the substrate and extends above a surface of the substrate; and a fourth STI layer disposed above the third STI layer and located above the surface of the substrate. The method further includes forming a field effect transistor (FET) disposed on the semiconductor substrate and having a first gate structure, an epitaxial first source/drain (S/D) region, and an epitaxial second S/D region, wherein the epitaxial first S/D region is disposed adjacent to the STI structure.

The foregoing has outlined rather broadly the features and technical advantages of the present disclosure so that those skilled in the art may better understand the detailed description that follows. Additional features and advantages of the present disclosure will be described hereinafter that form the subject of the claims. Those skilled in the art should appreciate that they may readily use the concept and the specific embodiment(s) disclosed as a basis for modifying or designing other structures for carrying out the same or similar purposes of the present disclosure. Those skilled in the art should also realize that such equivalent constructions do not depart from the spirit and scope of the claimed invention in its broadest form.

Before undertaking the Detailed Description below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which.

DETAILED DESCRIPTION

Figure 1:
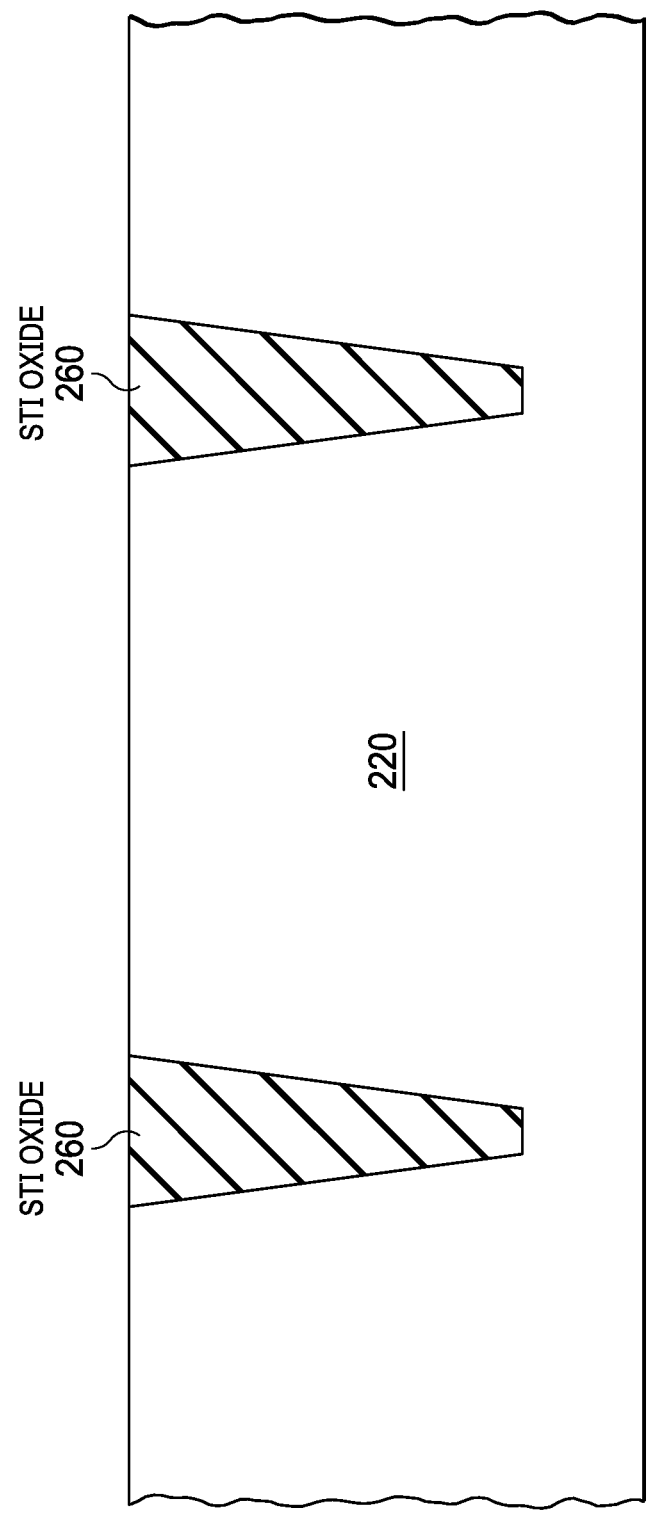
FIGS. 1, 2A, 2B, 3A, 3B, 4A, 4B, 4C, 4D, 5A, 5B, 5C and 5D are diagrams that illustrate a series of steps of one embodiment of a method or process for manufacturing an STI structure for use with FinFET-type devices.

The present disclosure describes a novel fin reveal process employing a COR only reveal process to form a more rectangular fin profile without substantial STI oxide loss. This is achieved using a novel STI oxide structure having a silicon nitride layer wrapped around and capping a substantial portion of the STI oxide.

The new STI structure includes a conventional trench structure formed of dielectric material extending into the substrate. A portion of the dielectric material and the substrate is removed (using an opening in a patterned hard mask (HM)) leaving a shallow recess below the substrate surface, and then another portion of the exposed dielectric material is removed forming a deeper recess into the trench structure. A layer of nitride is formed on the top of the remaining dielectric material in the trench structure, along the walls of the exposed substrate, and along the walls (and top) of the HM. This layer is referred to as a "liner".

A high aspect ratio process (HARP) oxide layer is deposited to fill the remaining recess and planarized to a level of the HM. Portions of the HARP oxide layer corresponding to the HM are removed forming recesses to a level above the substrate. A cap layer (e.g., nitride) is formed to cap the top of the exposed HARP oxide layer (and on the nitride layer on the sidewalls of the HM)—resulting in the HARP oxide layer being encased in, or substantially surrounded by, the nitride layer. The underlying STI and encased HARP oxide layer form a combined STI oxide structure. After further deposition and planarization/strip (e.g., removal of excess nitride and material, removal of nitride and HM, and deposition of another spacer/liner layer of nitride), the resulting combined STI oxide structure extends above the surface of the substrate (and above a gate or liner oxide layer disposed on the substrate) and is encased (or substantially surrounded) by a nitride liner layer. The resulting structure resembles a "mushroom" shape, wherein the mushroom top is disposed both below and above the substrate surface.

The novel STI structure has two main portions: a bottom portion of isolation material disposed deep in the substrate, and an upper portion of isolation material encased (or substantially surrounded) by a nitride layer. The upper portion includes a "mushroom" shaped top portion (wider than the bottom portion) disposed both above and below the main substrate surface.

Thereafter, other structures are conventionally formed on the substrate (e.g., dummy structures, active gates, S/D regions, contacts, etc.) are formed to construct the FinFET devices. The placement and configuration of the nitride layer, as well as the structure of the new STI structure, assist in forming a rectangle shape fin top profile and increasing fin height during a chemical oxide removal (COR) only fin reveal process.

FIGS. 1 through 6 and the various embodiments used to describe the principles of the present disclosure in this patent document are by way of illustration only and should not be construed in any way to limit its scope. Those skilled in the art will understand that the principles described herein may be implemented in any type of suitably arranged FET device.

To simplify the drawings, reference numerals from previous drawings will sometimes not be repeated for structures that have already been identified.

FIGS. 1 through 5D are diagrams that illustrate a series of relevant steps of one embodiment of a method or process for manufacturing one or more semiconductor devices, such as FinFET.

Now turning to FIG. 1, a semiconductor substrate 220 is provided and formed with multiple STI oxide structures 260 (only two are shown) disposed therein. To form the structure shown in FIG. 1, a mask (not shown) is formed above the substrate 220 and used with an etching/removal process that selectively removes portion(s) of substrate at the desired location(s) to form "shallow" trenches. Any suitable mask material may be used (e.g., nitride, oxide/nitride stack, photoresist material, etc.). The trenches are filled with material using a suitable process to form the STI oxide structures 260, and if necessary, planarization and mask removal occurs—resulting in the structure shown in FIG. 1.

The substrate 220 may be any suitable substrate material, such as bulk or epitaxially grown semiconductor material (e.g., silicon, silicon compounds) or silicon-on-insulator (SOI). The STI oxide structures 260 may be formed of any suitable material providing insulating and/or isolating functions, such as silicon oxide. Though not shown in FIG. 1, a thin layer of oxide may be formed within the trenches prior to formation of the STI oxide structures 260.

Figure 2A:
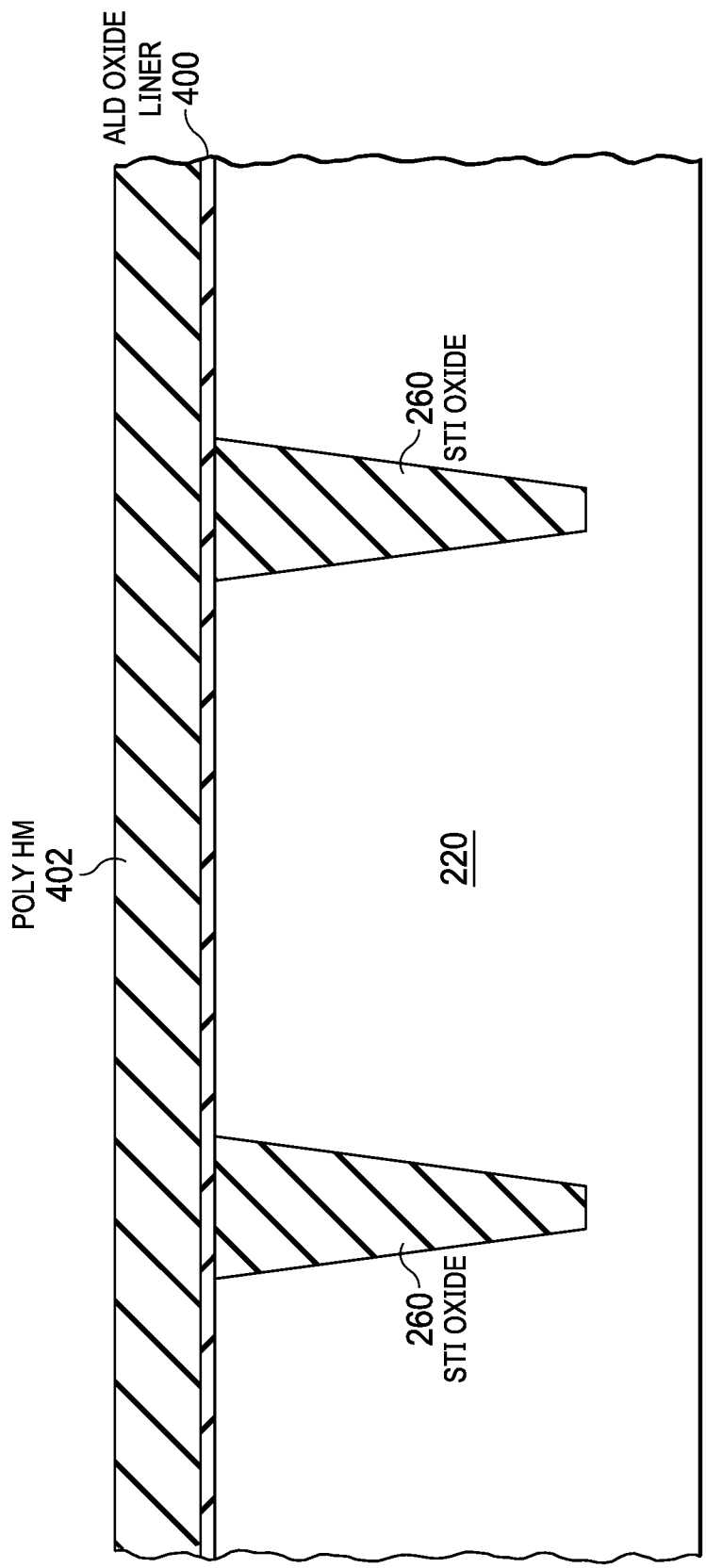

Now turning to FIG. 2A, the structure shown in FIG. 2 undergoes a deposition process which adds two layers to the substrate 220. An atomic layer deposition (ALD) of an oxide layer 400 is formed on the substrate 220, as shown. Any suitable oxide layer and formation process may be used. In one embodiment, the oxide layer 400 may be in the range of 1-5 nanometers thick, and more preferably between about 1-2 nm. Optionally, a cleaning step may be performed, such as DHF clean, prior to formation of the oxide layer 400. Next, a hard mask layer 402 is formed above the oxide layer 400. Although suitable material(s) may be utilized, in one specific embodiment, the hard mask (HM) layer 402 is formed of polysilicon, and on the order of 20-60 nanometers in thickness, and preferably around 40 nm.

After the oxide layer 400 and HM layer 402 are formed, a mask layer 404 (of suitable material) is formed with openings coincident with the STI structures, yet wider in area, which exposes the selected portions. The mask layer 404 selectively opens/exposes a wider portion above the STI oxide structures 260, as shown in FIG. 2B.

Figure 2B:
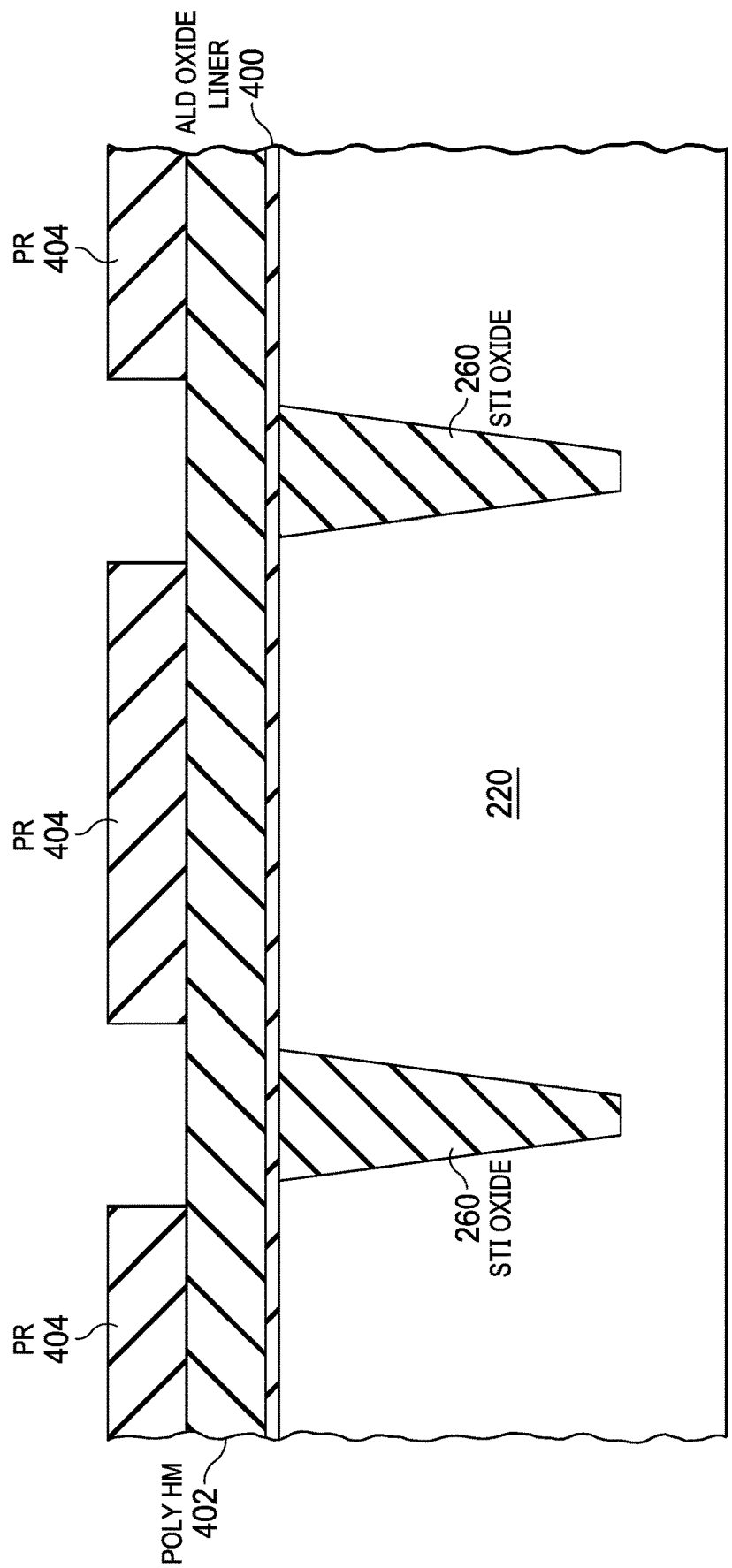
Figure 3A:
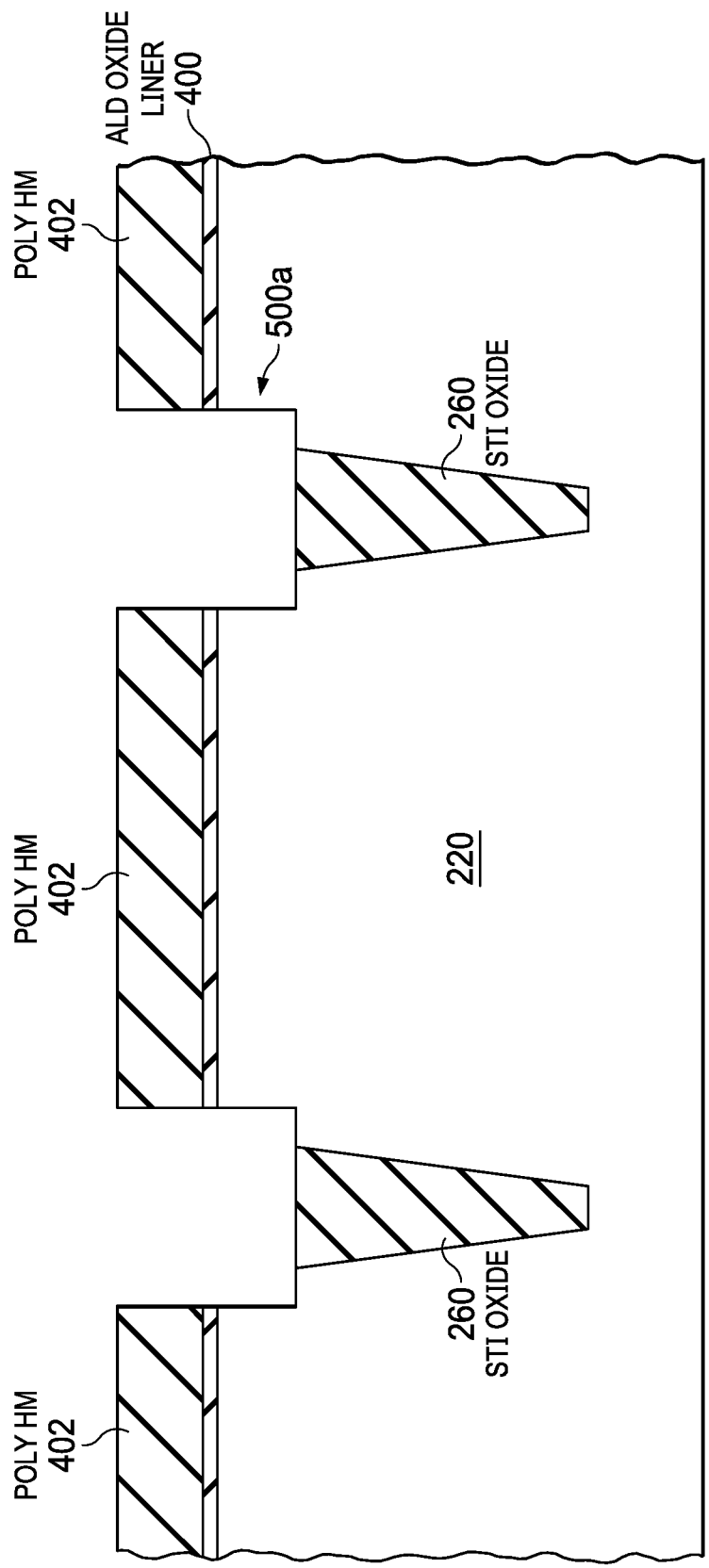
Figure 3B:
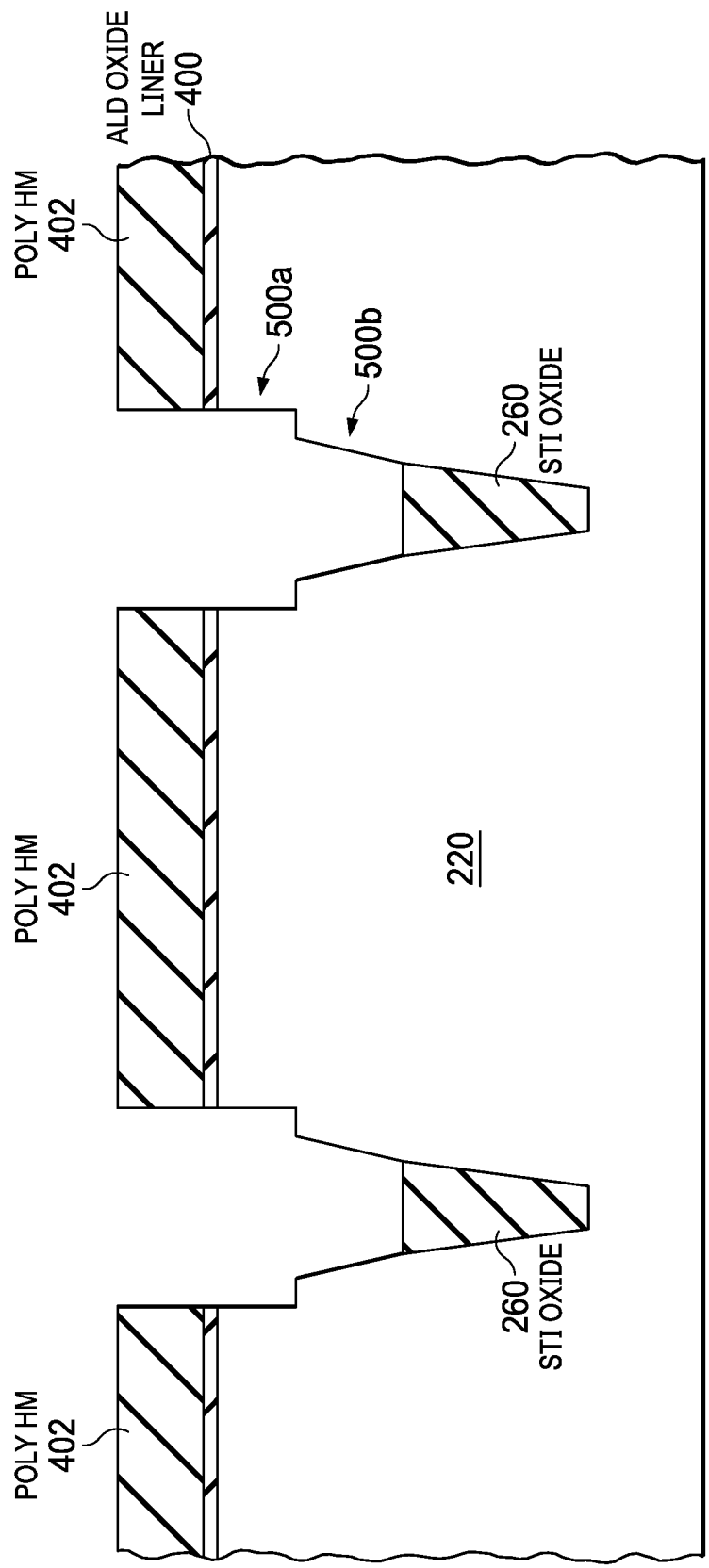

Now turning to FIG. 3A, the structure shown in FIG. 2B undergoes a removal process wherein the exposed portions of the HM layer 404, the oxide layer 402, the substrate 220 and a first, top portion of the STI oxide structures 260 are etched/removed—leaving a first recess 500a (a wider valley) formed above the structures 260 and into the substrate 220—as shown in FIG. 3A (shown with the mask layer 404 removed). The HM, oxide and silicon removal/etch process may include any suitable processing, and may be an integrated RIE process (e.g., HM etch selective to oxide, and non-selective etch for oxide and silicon at the same rate). The structure now shown in FIG. 3A undergoes another removal process wherein a second portion of the remaining STI oxide structures 260 are etched/removed—leaving a second recess 500b (a deeper valley) within the structures 260 and into the substrate 220—as shown in FIG. 3B. This STI removal process may be an isotropic dry etch, or other suitable process that does not remove silicon. After the second recess 500b is formed, an optional thin oxide growth/deposition step may be performed to form a thin layer (or liner) of oxide within the recess 500. Such optional oxide layer may be on the order of 1-2 nanometers thick.

Figure 4A:
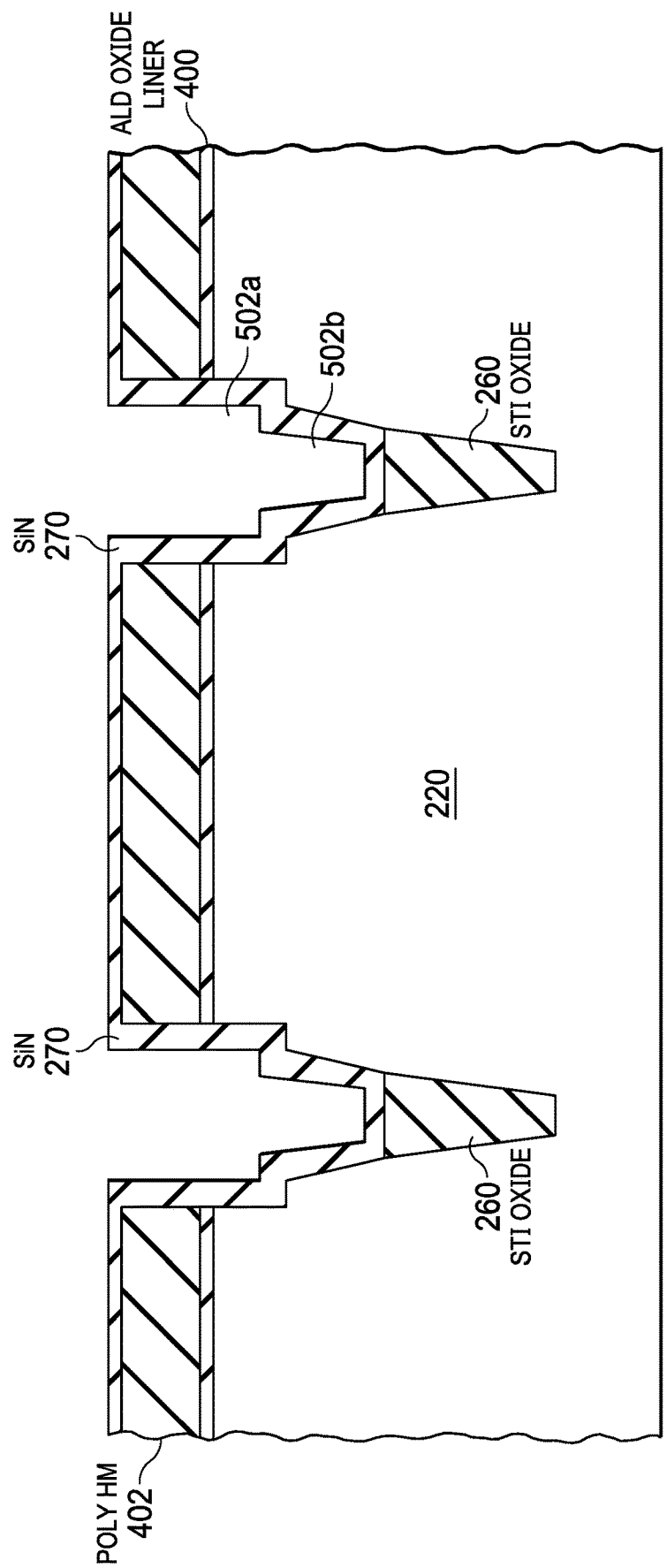

Now turning to FIG. 4A, the structure shown in FIG. 3B undergoes a deposition process in which the layer 270 is formed above the STI trenches, along surfaces of the exposed portion(s) of the substrate 220 (vertical sidewalls, angled sidewalls, etc.) and the other layers 400, 402—as shown. The layer 270 may be any suitable material, and preferably is a material that resists a later formation/etching/removal process that will occur during formation of the epitaxial S/D regions. In one embodiment, the layer 270 is formed of nitride, and particularly silicon nitride. In other embodiments, the layer 270 has a thickness in the range of about 2 to 7 nanometers (nm), and in another embodiment is about 4 nm. Once the layer 270 is formed—as shown in FIG. 4A—the resulting structure includes a trench 502 having a wider, shallower portion above a narrower, deeper portion (portions depicted by reference numerals 502a, 502b) above the STI oxide structures 260.

Figure 4B:
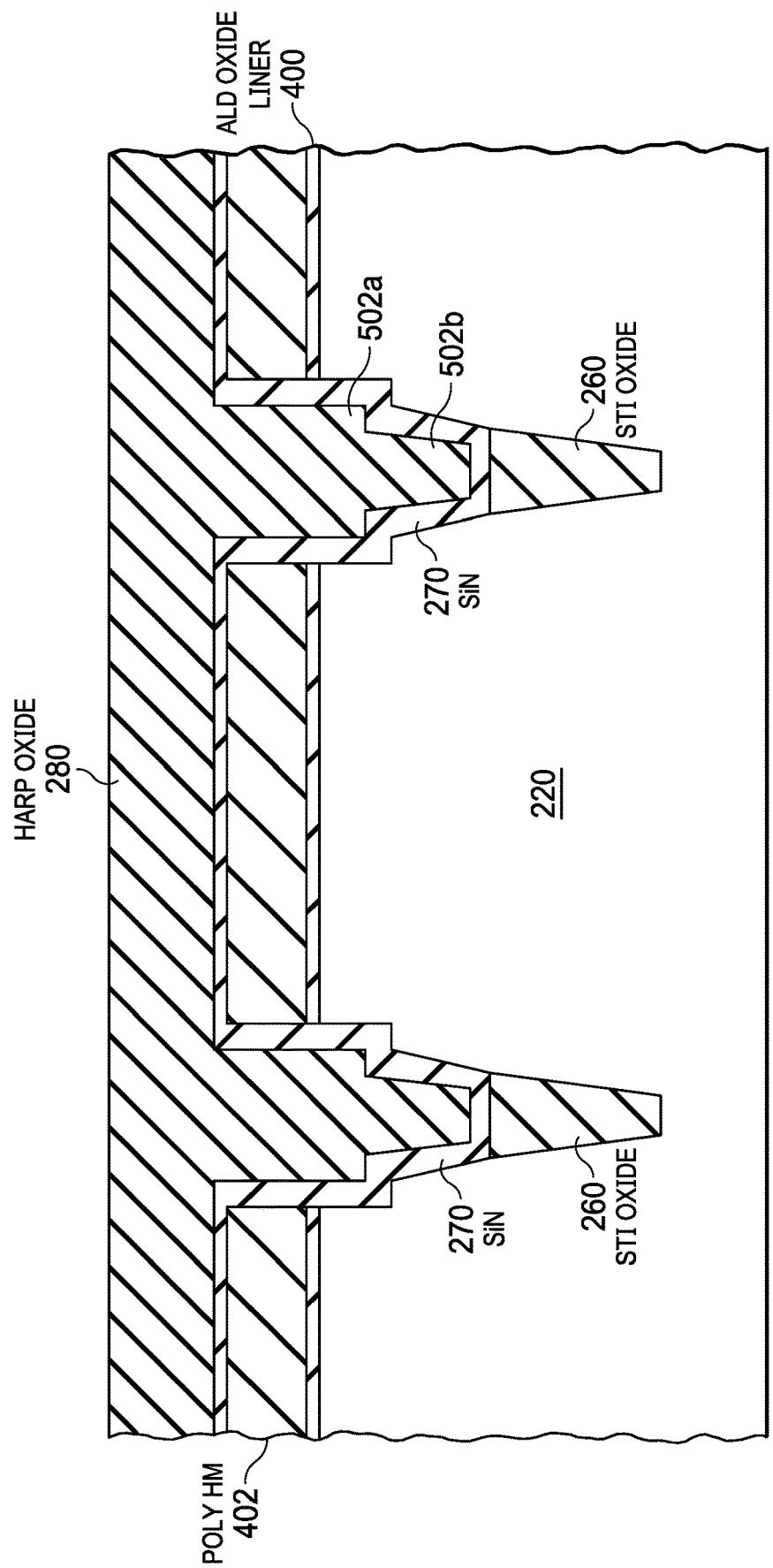

Now turning to FIG. 4B, the structure shown in FIG. 4A undergoes a fill and planarization process that fills the remaining portions 502a, 502b of trench 502 with insulating material and planarizes the structure. A suitable insulating layer or material 280, such as oxide, is formed or deposited in the trench 502 and above the layer 270. Any suitable deposition process may utilized, such as high aspect ratio process (HARP) deposition process. The structure is then planarized, using a suitable planarization process, such as by chemical-mechanical polishing (CMP), with either a stop on the layer 270 (or stop at the HM layer 402). This results in the structure shown in FIG. 4C.

Figure 4C:
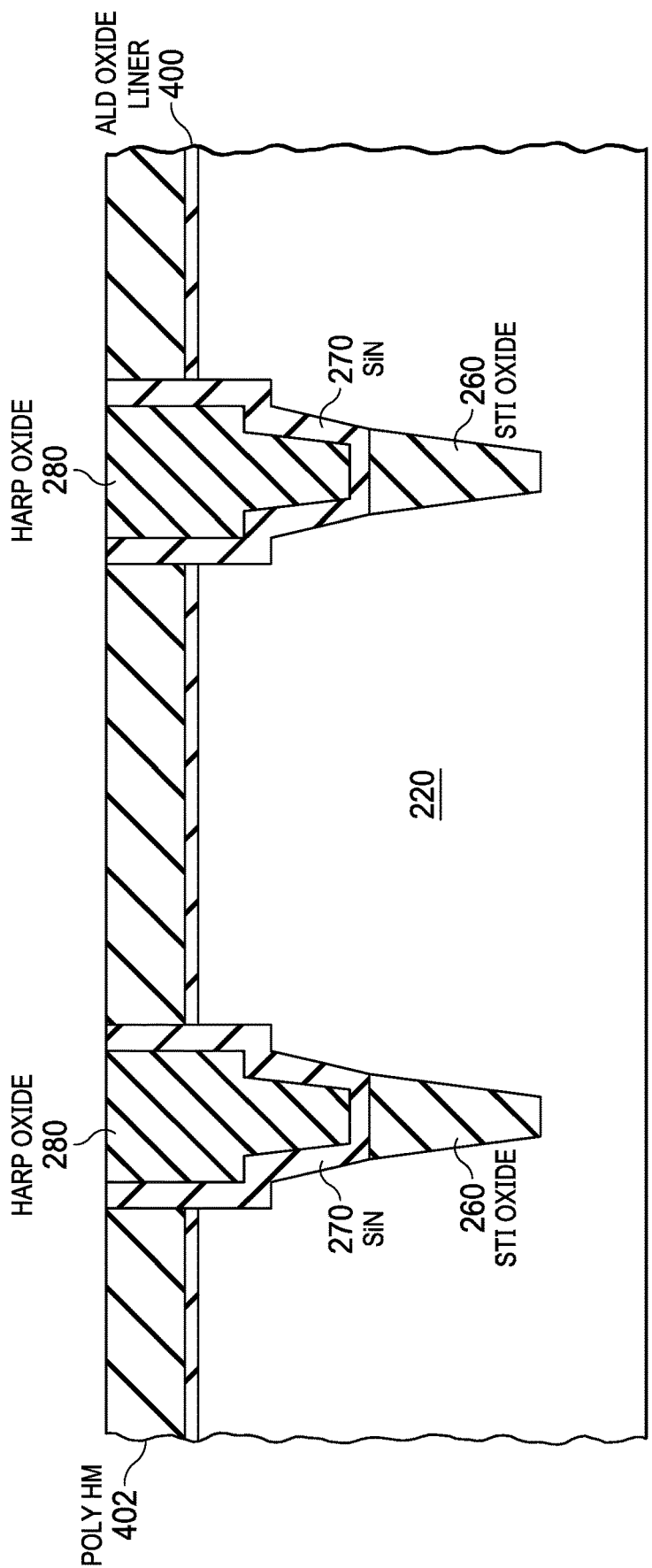
Figure 4D:
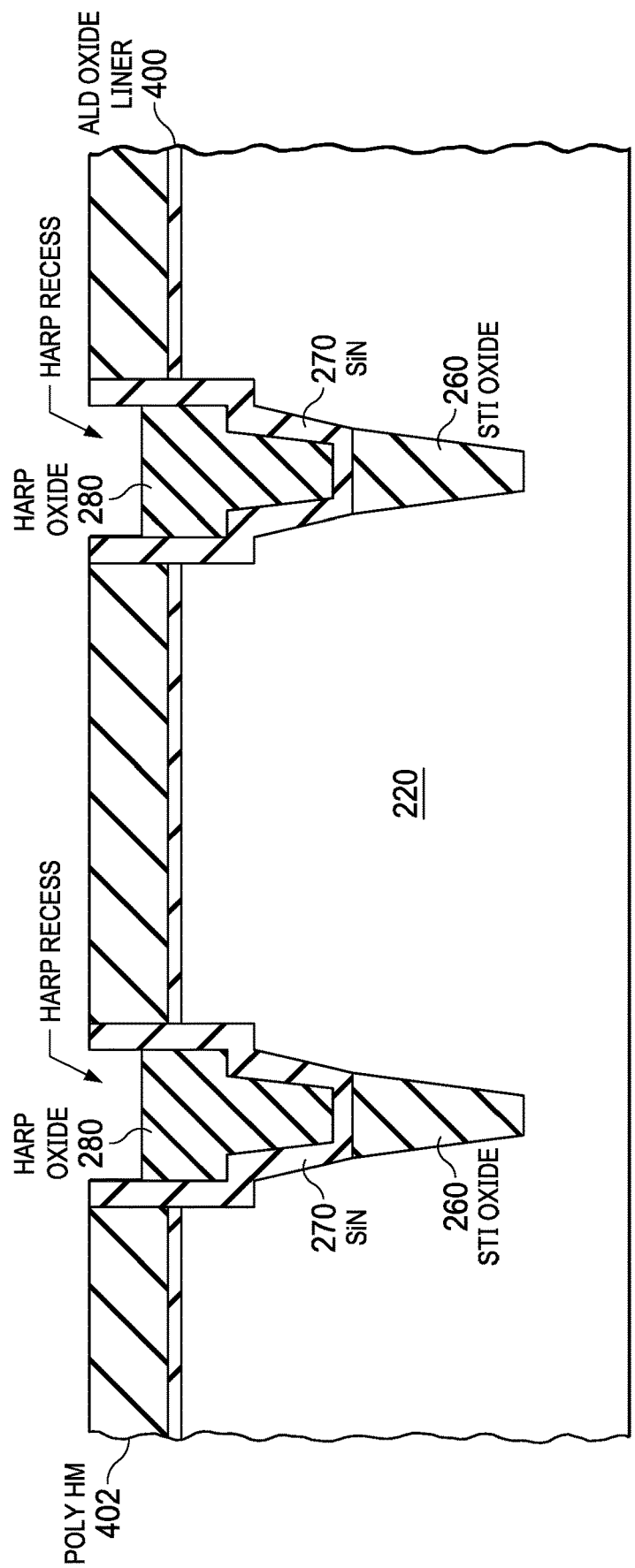

The structure shown in FIG. 4C undergoes further processing that removes a portion of the exposed oxide 280 and creates HARP recesses 281—as shown. In one embodiment, the recesses 281 are formed to remove on the order of 30-40 nm of the oxide 280 from the top surface (as shown in FIGS. 4C and 4D). Removal of the portions of the oxide 280 to create the HARP recesses 281 may be accomplished by any suitable removal/etch/strip process. The resulting structure is illustrated in FIG. 4D. The amount of oxide removed can vary depending on the particular dimensions of the process utilized. However, the amount removed should result in the top surface of the remaining oxide positioned above the top surface of the substrate 220 (and layer 400).

Figure 5A:
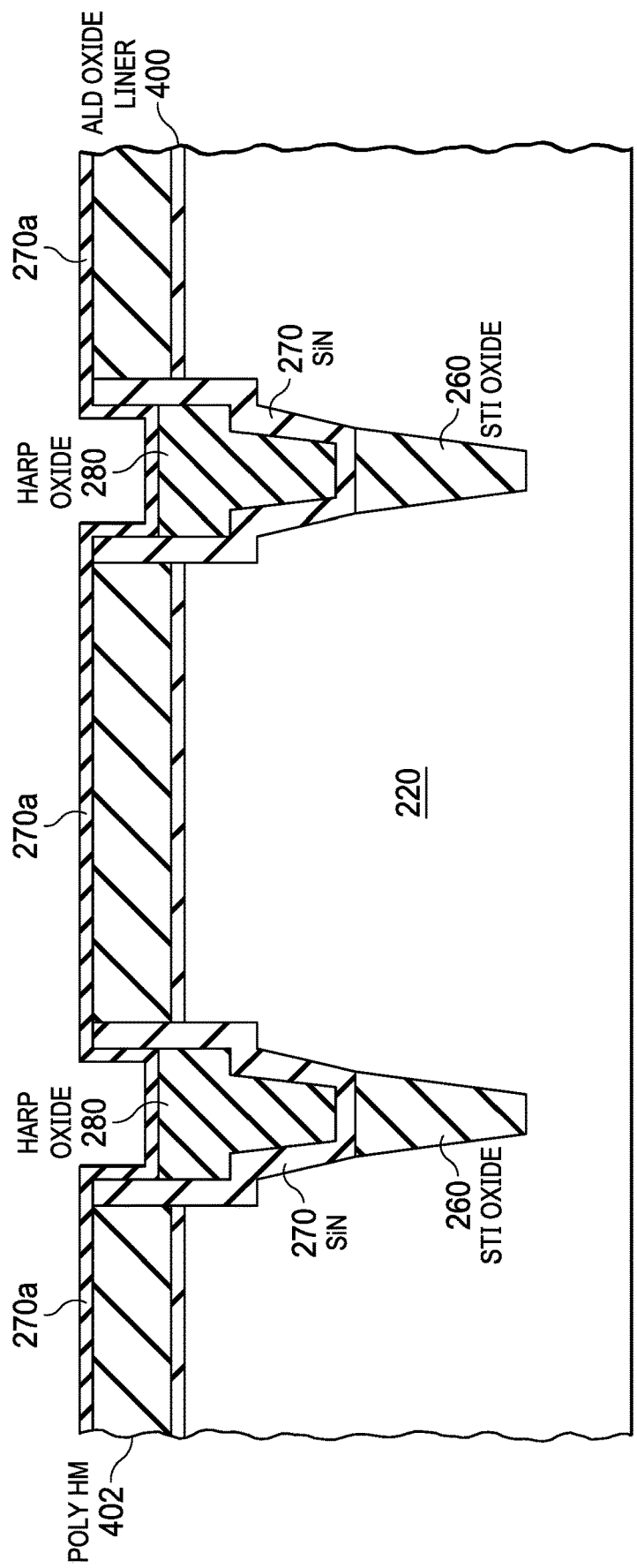

Now turning to FIG. 5A, the structure shown in FIG. 4D undergoes a deposition process in which a layer 270a is formed above the STI trenches, along surfaces of the exposed portion(s) of the layer 270 (vertical sidewalls) and the remaining HARP oxide 280 within the HARP recesses—as shown. The layer 270a may be any suitable material, and preferably in one embodiment, is nitride, and particularly silicon nitride. In different embodiments, the layer 270a has a thickness on the order of 10 nm or less, in a range of about 2 to 6 nanometers (nm), and in another embodiment is about 2 to 4 nm. The layer 270a is also referred to as a "capping" layer and functions to cap the remaining portion of the HARP oxide 280 forming part of the overall STI structure.

Figure 5B:
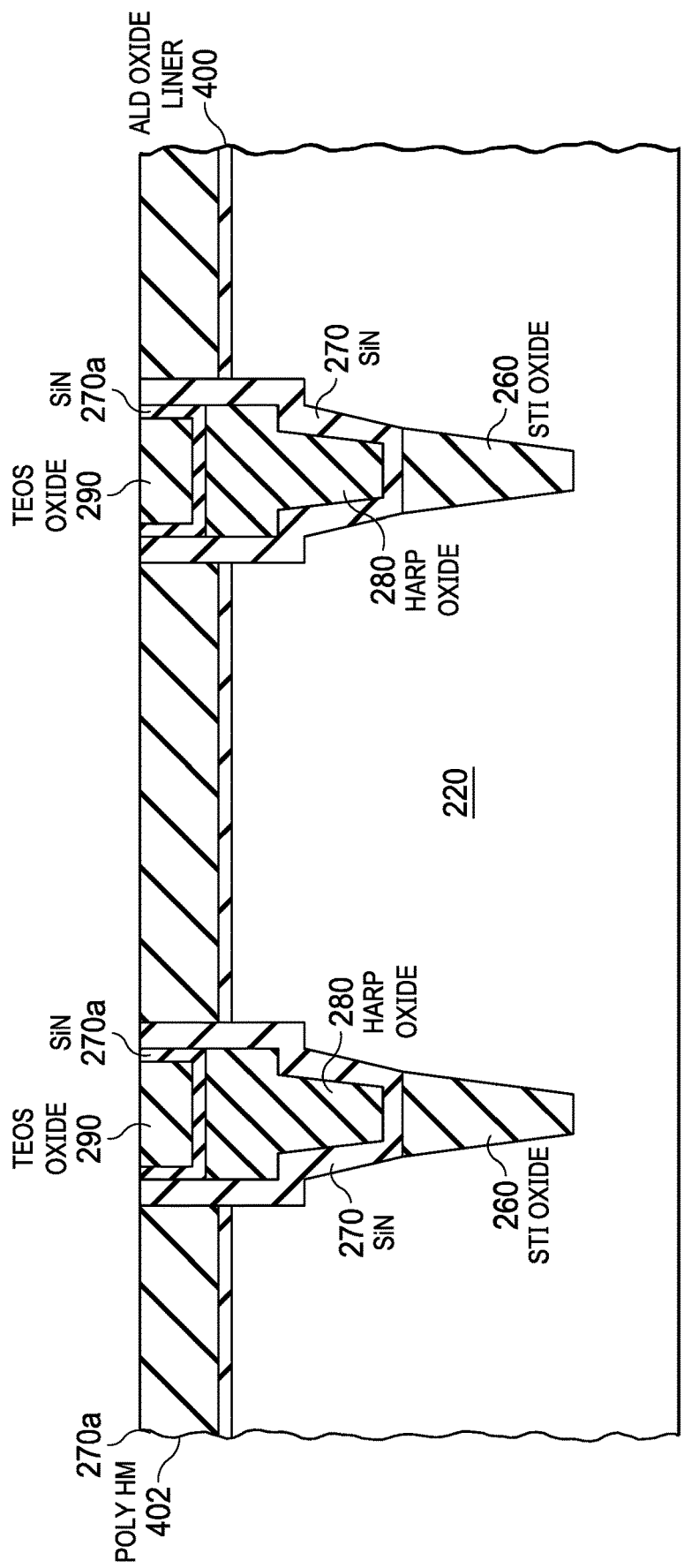

Now turning to FIG. 5B, the structure shown in FIG. 5A undergoes a fill and planarization process that fills the remaining portions of the trenches above the layer 270a with insulating material 290 and planarizes the structure. A suitable insulating layer or material 290, such as oxide, is formed or deposited in the trenches and above the layer 270a. Any suitable deposition process may utilized, such as TEOS process. The structure is then planarized, using a suitable planarization process, such as by chemical-mechanical polishing (CMP), which also removes the excess layer 270a on the HM 402. This results in the structure shown in FIG. 5B.

Figure 5C:
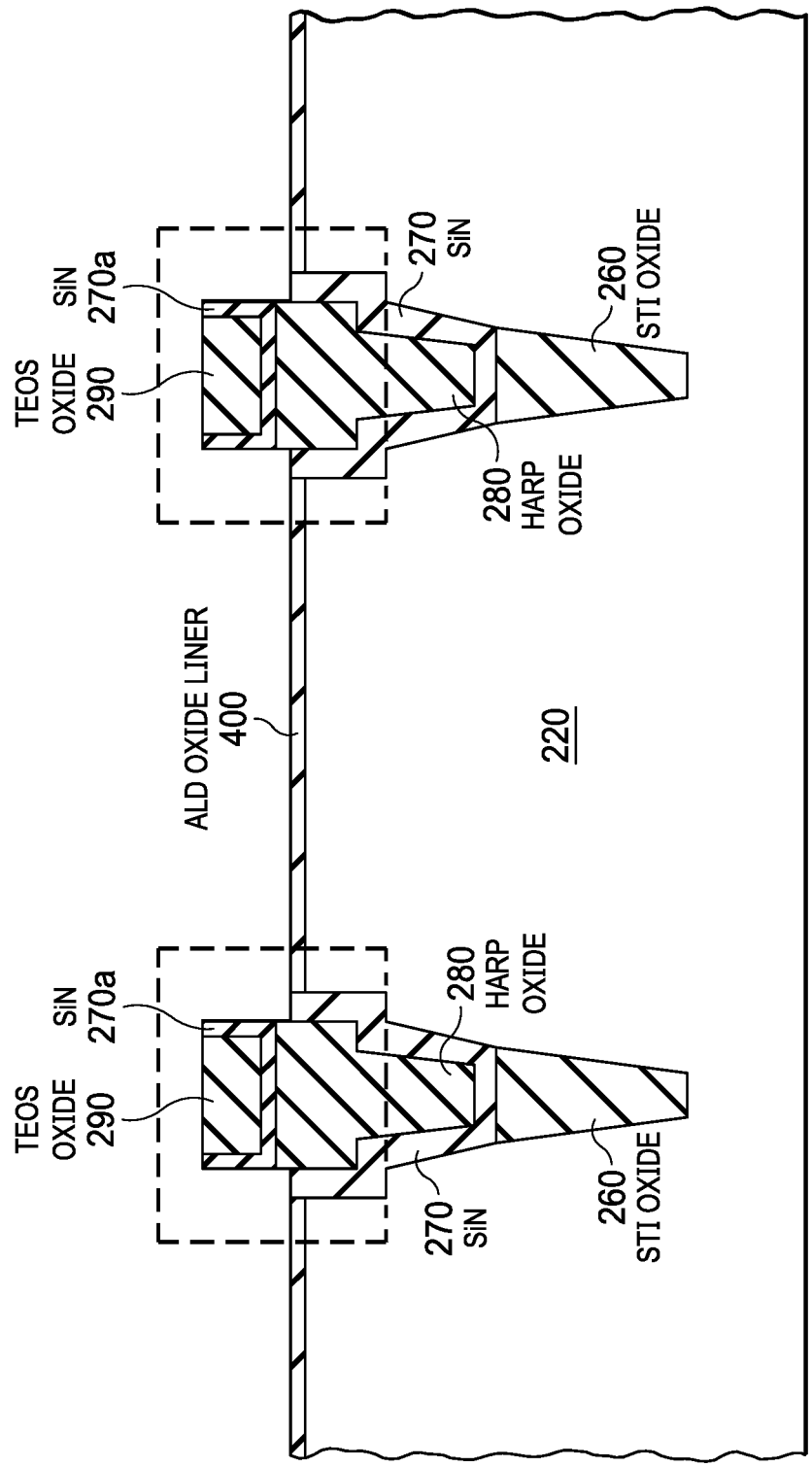

Now turning to FIG. 5C, the structure shown in FIG. 5B undergoes a removal process wherein the HM layer 404 is removed and portions of the layer 270 are removed. The HM and SiN removal/etch process may include any suitable processing, and may be an integrated RIE process (e.g., HM etch selective to oxide, and non-selective etch for oxide and silicon at the same rate). The structure now shown in FIG. 5C undergoes another deposition process in which a layer 270b (referred to as a "spacer liner" layer) is formed on the structure, along surfaces of the exposed portion(s) of the layer 270a (vertical sidewalls), the remaining TEOS oxide 290 and the remaining oxide liner 400 (the substrate 220). Formation of this layer is not shown in the Figures. The structure undergoes a removal/etch process wherein the layer 270b is etched to form sidewall spacers 275 along the sidewalls of the exposed STI structure (composed of exposed portions of the TEOS oxide 290, the layer 270a, the HARP oxide 280 and the layer 270). The SiN removal/etch process may include any suitable processing, and may be a dry RIE process to form the sidewall spacers that wrap around the portion of the STI structure that extends above the substrate surface. The resulting structure is shown on FIG. 5D.

Figure 5D:
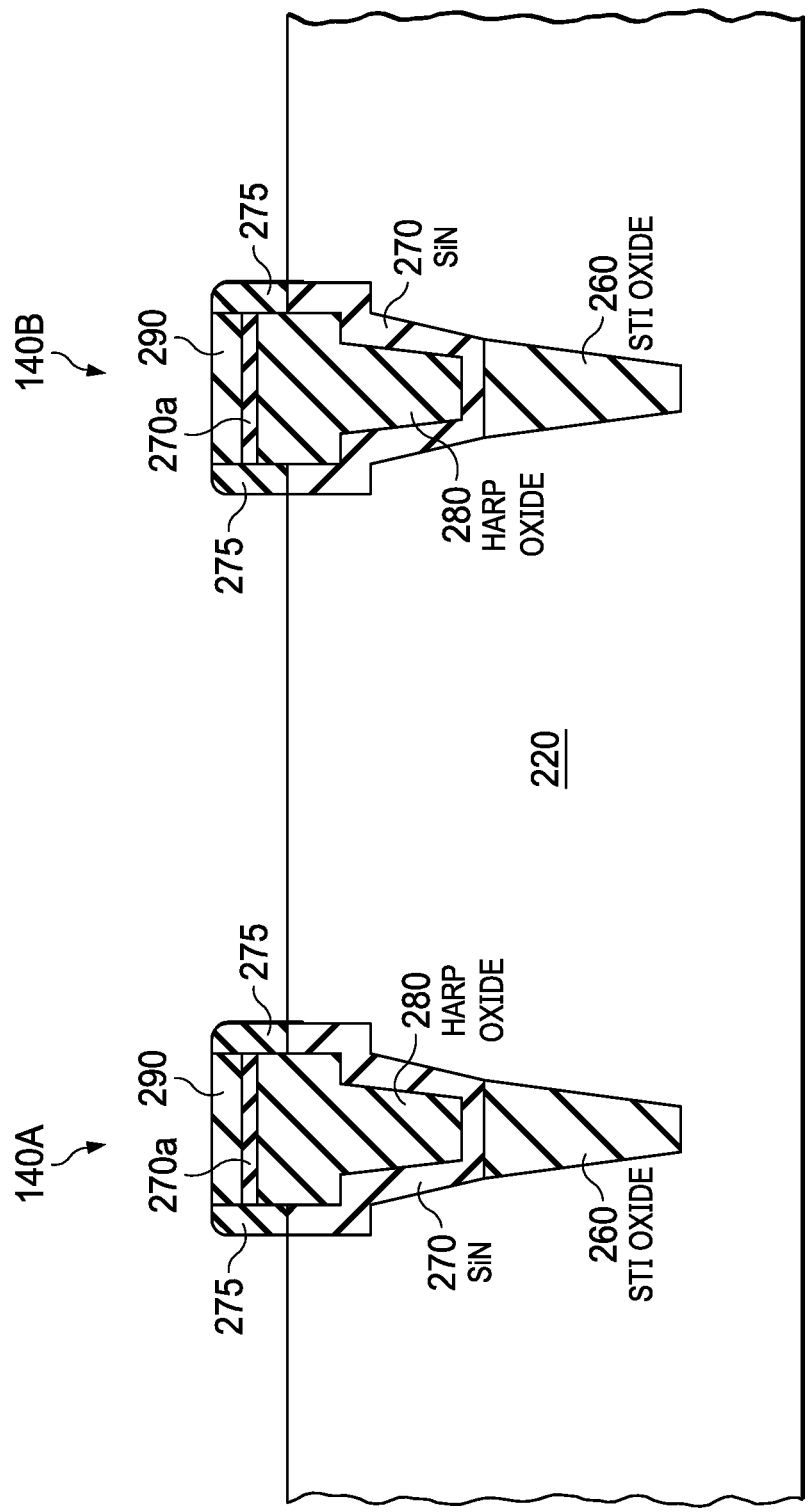

Although not shown, a Fin reveal process occurs on the structure shown in FIG. 5D that forms/reveals the fin structures (not shown in the FIGUREs), removes the oxide layer 400, and removes a portion of the oxide 280 (leaving some of the layer 270 above the surface of the substrate 220, not shown).

Although any suitable process(es) may be utilized for the fin reveal process, as described above, the preferred Fin reveal process involves performing only a single-stage, chemical oxide removal (COR) process (isotropic). As described earlier, utilization of isotropic-only etching/removal during the Fin reveal process is desirable to increase the height of the STI structure and form a more desirable rectangular shaped fin profile. In addition, this also assists in equalizing the Fin heights when the substrate includes both SDB and DDB structures and matching Fin height more closely, and also provides smaller silicon recess, which provides a larger area/volume for the eventual formation of the S/D regions.

After these process(es), the oxide 290 (the top portion of the combined STI structure) is disposed on the order of 20 to 30 nm above the surface of the substrate 220. The silicon nitride "capping" top layer (e.g., layer 270a) is disposed on the order of 10 nm above the surface of the substrate 220. Although these dimensions/thicknesses may vary, the overall STI structure extends on the order of about 20 to about 60 nm above the surface of the substrate 220.

While FIGS. 1-5D show relevant steps in one embodiment of forming the various components of the device 100, additional conventional/typical semiconductor manufacturing processes generally follow (which are not described herein, and is unnecessary for the understanding of the teachings herein). Further, not all processing steps may be shown—only those relevant to the understanding of the present disclosure.

As will be appreciated, the STI oxide structure 260, the layer 270 thereabove, and the remaining portion of the oxide layer 280, layer 270a, and oxide layer 290 together form the overall combined STI structures 140A, 140B.

Figure 6:
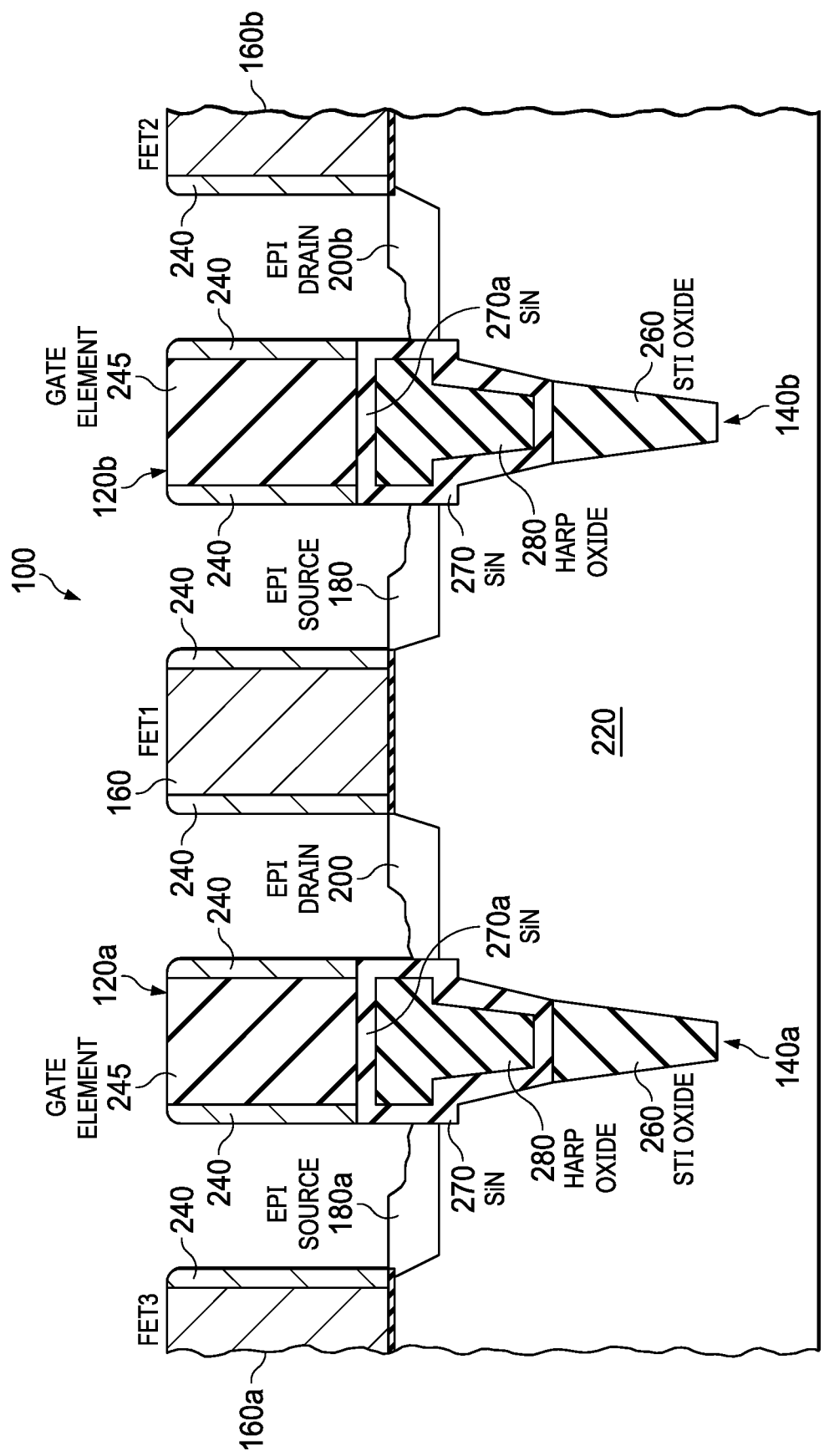
FIG. 6 illustrates a cross-sectional view of three FinFET-type semiconductor devices and STI structures in accordance with the present disclosure.

Now turning to FIG. 6, further processing of the structure shown in FIG. 5D includes forming dummy gate structures 120A, 120B (or other structure(s)) above STI structures 140A, 140B. Active gate structures 160, 160A, 160B are also formed above the substrate 220, and as shown, the active gate structure 160 is formed between the adjacent STI structures 140A and 140B. As will be appreciated, further conventional processing occurs to form the semiconductor device 100 (as shown in FIG. 6).

The semiconductor device 100 includes the semiconductor substrate 220 including a pair of dummy gates 120A, 120B disposed above a pair of shallow trench isolation (STI) structures 140A, 140B each providing a single diffusion break. As will be appreciated, the dummy gates 120A, 120B could be formed of other suitable material(s). A FinFET device 160 is disposed between the STI structures 140A, 140B which provide isolation for the FinFET device 160. Also shown is a pair of neighboring FinFETS 160A and 160B (each only partially shown). The FinFET 160 is shown with epitaxial source/drain (S/D) regions 180, 200 formed in the substrate 220. Similarly, although only partially shown, the FinFETs 160A, 160B each have two epitaxial S/D regions (and only source region 180A and drain region 200B are shown). Further, only the relevant portions of the FinFET devices 160, 160A, 160B are shown, and the source and drain contacts (and actual gate contacts) are not illustrated.

It will also be understood that, depending on the type of FET device desired, S/D regions 180, 200 will be doped with either n-type or p-type impurities, while their corresponding channel regions (in the substrate 220) may be doped with the opposite type—either p-type or n-type (or no type), respectively.

It will be understood that the present disclosure may be embodied in many different forms and should not be construed as limited to the exemplary embodiments set forth herein. Terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. The terms "comprises" and/or "comprising", or "includes" and/or "including", when used in this specification, specify the presence of stated features, regions, structures, elements, and/or components, but do not preclude the presence or addition of one or more other of these. Reference throughout this specification to "one embodiment," "an embodiment," "embodiments," "exemplary embodiments," or similar language means that a particular feature, structure, or characteristic described in connection with the embodiment is included in at least one embodiment of the present disclosure.

If used, the terms "overlying" or "atop", "positioned on" or "positioned atop", "underlying", "beneath" or "below" mean that a first element, such as a first structure, e.g., a first layer, is present on a second element, such as a second structure, e.g., a second layer, wherein intervening elements, such as an interface structure, e.g. interface layer, may be present between the first element and the second element.

As used herein, "depositing" or "forming" may include any now known or later developed techniques appropriate for the material to be deposited or formed including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UH-VCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer 20 deposition (ALD), chemical oxidation, molecular beam epitaxy (MBE), plating, evaporation.

It will be understood that well known processes have not been described in detail and have been omitted for brevity. Although specific steps, structures and materials may have been described, the present disclosure may not limited to these specifics, and others may substituted as is well understood by those skilled in the art, and various steps may not necessarily be performed in the sequences shown.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A semiconductor device comprising:
   a semiconductor substrate;
   a shallow trench isolation (STI) structure disposed within the semiconductor substrate, the STI structure comprising:
      a first STI layer disposed in the substrate,
      a second STI layer disposed above the first STI layer and within the substrate, the second STI layer comprising, a first lower layer disposed above the first STI layer, a first vertical layer disposed along a first vertical sidewall of the substrate, and a second vertical layer disposed along a second vertical sidewall of the substrate, and a third STI layer disposed above the first lower layer of the second STI layer, wherein the third STI layer is disposed within the substrate and extends above a surface of the substrate, and wherein the third STI layer comprises:

a lower portion of a first dielectric material;
a middle portion of a second dielectric material; and
an upper portion of a third dielectric material; and a field effect transistor (FET) disposed on the semiconductor substrate and having a first gate structure, an epitaxial first source/drain (S/D) region, and an epitaxial second S/D region, wherein the epitaxial first S/D region is disposed adjacent to the STI structure.

2. The device in accordance with claim 1 wherein the second STI layer comprises nitride.

3. The device in accordance with claim 1 wherein the first dielectric material and the third dielectric material each comprise oxide, and the second dielectric material comprises nitride.

4. The device in accordance with claim 3 wherein the STI structure further comprises one or more sidewall spacers along at least one or more sidewall portions of the third STI layer extending above the surface of the substrate.

5. The device in accordance with claim 4 wherein the second STI layer and the one or more sidewall spacers comprise nitride, and the third STI layer is substantially encased in nitride corresponding to the second STI layer, the middle portion of the third STI layer, and the at least one sidewall spacer.

6. The device in accordance with claim 1 wherein the second STI layer separates the first STI layer from the third STI layer and separates the third STI layer from the substrate.

7. The device in accordance with claim 1 wherein the STI structure has a mushroom shape having a cap and a stem, the first STI layer forms the stem, the second and third STI layers form the cap, and at least a portion of the third STI layer is disposed above a surface of the substrate.

8. The device in accordance with claim 1 wherein the STI structure has a mushroom shape having a cap and a stem, the first STI layer forms at least a part of the stem, at least a portion of the second and third STI layers also foil at least a part of the stem, at least another portion of the second and third STI layers form the cap, and at least a portion of the third STI layer is disposed above a surface of the substrate.

9. A method of fabricating a semiconductor device for use with one or more field-effect transistor (FinFET) devices, the method comprising:

forming a shallow trench isolation (STI) structure within a semiconductor substrate from a shallow trench of first insulating material, comprising, forming a mask layer to selectively expose the first insulating material and adjacent portions of the semiconductor substrate, removing a first portion of the first insulating material and the substrate using the mask layer to form a first recess in the substrate having a first depth and expose vertical sidewall portions of the substrate, removing a second portion of the first insulating material using a chemical oxide removal process, thereby foil ling a second recess having a second depth wherein a third portion of the first insulating material remains, forming an inner spacer layer above the third portion of the first insulating material and along the exposed vertical sidewalls of the substrate, forming a layer of second insulating material above the inner spacer layer, the second insulating material extending above a surface of the substrate and below a top surface of the masking layer, forming a capping layer above the second insulating material, forming a layer of third insulating material above the capping layer, thereby forming the STI structure comprising the third portion of first insulating material, the inner spacer layer, the second insulating material, and the capping layer, and the third insulating material, and removing the mask layer, wherein at least a portion of the STI structure is disposed above the surface of the substrate.

10. The method in accordance with claim 9 further comprising:

after forming the STI structure, performing an isotropic Fin reveal process to reveal one or more fin structures.

11. The method in accordance with claim 10 wherein performing the isotropic Fin reveal process comprises:

performing a chemical oxide removal (COR) process.

12. The method in accordance with claim 9 further comprising:

forming at least one sidewall spacer along at least a portion of the layer of third insulating material.

13. The method in accordance with claim 9 wherein the inner spacer layer comprises nitride and the capping layer comprises nitride.

14. The method in accordance with claim 13 wherein the layer of first insulating material and the layer of third insulating material each comprise oxide.

15. The method in accordance with claim 13 further comprising:

forming at least one sidewall spacer along at least a portion of the layer of third insulating material, wherein the one or more sidewall spacers comprise nitride; and wherein the second and third layers of insulating material are substantially encased in nitride corresponding to the inner spacer layer, the capping layer and the at least one sidewall spacer.

16. A method of fabricating a semiconductor device for use with one or more field-effect transistor (FinFET) devices, the method comprising:

forming a shallow trench isolation (STI) structure within a semiconductor substrate from a shallow trench of first insulating material, the STI structure comprising, a first STI layer disposed in the substrate, a second STI layer disposed above the first STI layer and within the substrate, the second STI layer comprising, a first lower layer disposed above the first STI layer, a first vertical layer disposed along a first vertical sidewall of the substrate, and a second vertical layer disposed along a second vertical sidewall of the substrate, a third STI layer disposed above the first lower layer of the second STI layer, wherein the third STI layer is disposed within the substrate and extends above a surface of the substrate, and a fourth STI layer disposed above the third STI layer and located above the surface of the substrate; and forming a field effect transistor (FET) disposed on the semiconductor substrate and having a first gate structure, an epitaxial first source/drain (S/D) region, and an epitaxial second S/D region, wherein the epitaxial first S/D region is disposed adjacent to the STI structure.

17. The method in accordance with claim 16 wherein:
the second STI layer comprises silicon nitride; and
the fourth STI layer comprises silicon nitride.

18. The method in accordance with claim 17 wherein the second STI layer is substantially encased in silicon nitride.

19. The method in accordance with claim 18 wherein the STI structure has a mushroom shape having a cap and a stem, the first STI layer forms at least part of the stem, at least portions of the third and fourth STI layers form the cap and are disposed above a surface of the substrate.

* * * * *